United States Patent [19]

Rowe

[11] 4,174,307

[45] Nov. 13, 1979

[54] ROOM-TEMPERATURE-RADIATION-CURABLE POLYURETHANE

[75] Inventor: William Rowe, Westfield, N.J.

[73] Assignee: Polychrome Corporation, Yonkers, N.Y.

[21] Appl. No.: 929,155

[22] Filed: Jul. 31, 1978

Related U.S. Application Data

[63] Continuation of Ser. No. 617,614, Sep. 29, 1975, abandoned, which is a continuation of Ser. No. 315,212, Dec. 14, 1972, abandoned.

[51] Int. Cl.$^2$ ............... C08G 18/67; C08L 75/04; C08L 91/00
[52] U.S. Cl. ............... 204/159.19; 528/48; 528/49; 528/50; 528/51; 528/55; 528/56; 528/58; 528/59; 528/73; 528/75; 260/18 TN; 525/123
[58] Field of Search ............... 528/75; 204/159.19; 260/859 R

[56] References Cited

U.S. PATENT DOCUMENTS

| | | | |
|---|---|---|---|
| 3,100,759 | 8/1963 | Boussu et al. | 260/77.5 AM |
| 3,297,745 | 1/1967 | Fekete et al. | 260/77.5 AP |
| 3,345,311 | 10/1967 | Ehrlich et al. | 260/18 TN |
| 3,425,973 | 2/1969 | Shaw | 260/18 TN |
| 3,499,852 | 3/1970 | Schroeder et al. | 260/18 TN |
| 3,509,234 | 4/1970 | Burlant et al. | 260/77.5 CR |
| 3,553,174 | 1/1971 | Hausslein et al. | 260/77.5 CR |
| 3,600,359 | 8/1971 | Miranda | 260/18 TN |
| 3,719,638 | 7/1972 | Huemmer et al. | 260/77.5 CR |
| 3,759,809 | 9/1973 | Carlick et al. | 260/18 TN |
| 3,782,961 | 1/1974 | Takahashi et al. | 204/159.14 |
| 3,939,126 | 2/1976 | Carder et al. | 528/75 |
| 3,954,584 | 5/1976 | Miyata et al. | 204/159.24 |
| 4,013,806 | 3/1977 | Volkert et al. | 204/159.19 |

OTHER PUBLICATIONS

Saunders et al., Polyurethanes Part I, Interscience (New York, 1962), pp. 150-160; Same–Part II, pp. 300-303.

*Primary Examiner*—H. S. Cockeram

[57] ABSTRACT

Novel compounds which are the products of monomeric organic reactants containing one or more active hydrogen atoms as determined by the Zerewitinoff method, e.g., a polyol, and organic polyisocyanates, e.g., diisocyanates, in such amounts as to provide about two isocyanate groups for each active hydrogen-containing group thereby forming isocyanate terminated intermediates which are reacted with monomeric organic reactants having at least one active hydrogen-containing group and preferably also an unsaturated group, preferably in a terminal position. One of the monomeric organic active hydrogen-containing reactants must have only one active hydrogen. The novel compounds of this invention which have unsaturated groups are useful as monomers especially in systems utilizing free radical generating addition polymerization initiators which are activatable by actinic light and may be used in the preparation of finishes for woods and metals or in the formulation of inks, both of which may be solvent-free and are curable by exposure to actinic light. Those of the compositions of this invention which do not contain unsaturation may be used as plasticizers in the aforementioned formulations.

10 Claims, No Drawings

ROOM-TEMPERATURE-RADIATION-CURABLE POLYURETHANE

CROSS REFERENCE TO RELATED APPLICATIONS

This application is a continuation of copending patent application Ser. No. 617,614, filed Sept. 29, 1975, which was a continuation of patent application Ser. No. 315,212, filed Dec. 14, 1972, both now abandoned.

This invention relates to novel compounds that are suitable for many purposes as will be indicated hereinafter.

Generally the novel compounds of this invention are those which may be produced by reacting a monomeric organic compound containing at least one active hydrogen atom as determined by the Zerewitinoff method with an organic polyisocyanates, e.g., diisocyanate in such relative amounts that there are approximately two isocyanate groups from the organic polyisocyanate for each active hydrogen atom from the first compound. There are thereby produced compounds which have terminal isocyanate groups. Those compounds are subsequently reacted with monomeric compounds containing at least one active hydrogen atom preferably also containing olefinic unsaturation; most preferably in a terminal position. The resultant products are the novel compounds of this invention. Those of the compounds which contain unsaturation are useful as unsaturated monomers for a variety of purposes, for example, they may be used in compositions containing diazonium compounds to form, for example, lithographic plates which have exceptionally long press life, which compositions form the subject matter of an application of William Rowe and Eugene Golda Ser. No. 315,207 now abandoned which was continued in Ser. No. 595,466 now abandoned on July 14, 1975 and in Ser. No. 000,865 filed Jan. 4, 1979, filed concurrently herewith. The unsaturated novel compounds of this invention are also useful in the preparation of finishes for woods, metals etc. or in the formulation of inks, both of which may be curable to a greater or lesser degree by the exposure of the coatings to actinic light. The novel compounds of this invention which do not contain unsaturation are useful as diluents and as plasticizers which are especially compatible in compositions containing the unsaturated novel compounds of this invention.

Illustrative of the organic diisocyanates are, e.g., the aromatic, aliphatic, and cycloaliphatic diisocyanates, and combinations thereof. More specifically illustrative of the diisocyanates are 2,4-tolylene diisocyanate, m-phenylene diisocyanate, xylylene diisocyanate, 4-chloro-1, 3-phenylene diisocyanate, 4,4'-biphenylene diisocyanate, 1,4-tetramethylene and 1,6-hexamethylene diisocyanate, 1,4-cyclohexylene diisocyanate, 1,5-tetrahydronaphthalene diisocyanate, methylene dicyclohexylene diisocyanate and the like. Diisocyanates in which each of the two isocyanate groups is directly attached to a ring are preferred, since, generally, they react more rapidly with polyols, or other active hydrogen-containing compounds. Especially preferred types are

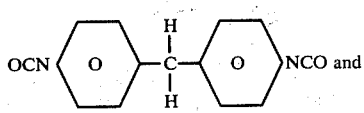 and

-continued

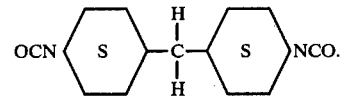

The diisocyanates can contain other substituents, although those which are free from reactive groups other than the two isocyanates groups are preferred. Mixtures of diisocyanates may also be used to prepare the unsaturated monomers used in this invention.

The active hydrogen atoms referred to above are those which display activity according to the Zerewitinoff test as described by Kohler, J. Am. Chem. Soc. 49, 3181 (1927).

Water may be used as an active hydrogen containing compound in the preparation of the isocyanate terminated polyisocyanates. Biuret polyisocyanates are thereby produced in accordance with the disclosure of U.S. Pat. No. 3,124,605, which describes a compound having not more than six —NCO groups and the formula:

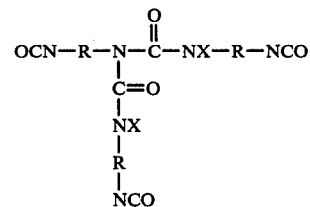

wherein X is selected from the group consisting of hydrogen and the grouping —CO—NX—R—NCO and R is the organic radical left after removal of the two —NCO groups from an organic diisocyanate selected from the group consisting of cyclohexane diisocyanate, hexamethylene diisocyanate, phenylene diisocyanate, lower alkyl substituted phenylene diisocyanate, lower alkoxy phenylene diisocyanate, diphenylmethane diisocyanate, dicyclohexyl diisocyanate and chloro-substituted phenylene diisocyanate, said hydrogen being the only one on the compound which is reactive with an —NCO group.

Illustrative of the useful compounds containing active hydrogen atoms are those in which the active hydrogen atoms are attached to oxygen, nitrogen, or sulfur, i.e., the groups containing the active hydrogen are hydroxyl, mercapto, imino, amino, carboxyl, carbamoyl, substituted carbamoyl, sulfo, sulfonamido, thiocarbamoyl, substituted thiocarbamoyl, and the like. The compounds can otherwise be aliphatic, aromatic, or cycloaliphatic, or of mixed types.

Illustrative of the active hydrogen-containing compounds used to prepare the intermediates for the novel compounds of this invention are those containing aliphatic hydroxyl, phenolic hydroxyl, thiol, carboxyl, amine or amide groups. Those compounds which contain more than one active hydrogen atom per molecule are preferred.

Illustrative of the hydroxyl containing compounds which may be used are the alkanols containing up to about 18 carbon atoms, e.g., methanol, ethanol, propanol, butanol, etc.; cycloalkanols, e.g., cyclohexanol, etc.; the alkenols, e.g., allyl alcohol, etc.; cinnamoyl alcohol, and the polyols.

Illustrative of the polyols are the diols, triols, tetraols etc. The monomeric diols, triols and tetraols are generally preferred.

More specifically illustrative of the monomeric diols are ethylene glycol; propylene glycol; 1,3-butylene glycol; 1,4-butane diol; 1,5-pentanediol, hexamethylene glycol, etc, mono fatty acid esters of trimethylolethane, trimethylolpropane, and the like. More specifically illustrative of the monomeric triols are trimethylolpropane, glycerol, castor oil, fatty acid monoglycerides, e.g., ricinoleic monoglyceride, ricinoleic monoglycolate, monofatty acid esters of pentaerythritol, etc. More specifically illustrative of the tetraols is pentaerythriol. It is preferred that the hydroxyl containing compounds, e.g., the polyols, have a molecular weight of up to about 1,000 or higher. Preferably they have a molecular weight of up to about 950, most preferably up to about 500.

Illustrative of the phenols which may be reacted to form the intermediates are phenol, o-cresol, 4,4'-propylidenediphenol, 4,4'-isopropylidenediphenol, etc.

Illustrative of the thiol compounds which may be used to prepare the intermediates are the monothiols, e.g., 1-butanethiol, 1-dodecanethiol, tert-butanethiol, etc.; and monomeric polythiols. Polythiols, such as the aliphatic monomeric polythiols exemplified by ethane dithiol, hexamethylene dithiol, decamethylene dithiol, tolylene-2,4-dithiol, and the like, are operable but may not be widely accepted from a practical commercial point of view because of obnoxious odors. The preferred thiol compounds are characterized by a low level of mercaptanlike odor initially.

Illustrative of compounds which contain carboxyl groups and which may be used to prepare the intermediates are acetic acid, cinnamic acid, $\beta$-phenylpropionic, succinic acid, adipic acid, terephthalic acid, thiodipropionic acid, and the like, fatty Acids having 6 or more carbon atoms, e.g., caproic acid, lauric acid, ricinoleic acid, linoleic acid, etc.

Illustrative of the amines which may be reacted to form the intermediates are ammonia, ethylamine, n-propylamine, n-butylamine, n-amylamine, aniline, and the like; and the polyamines, e.g., m-phenylenediamine, propylenediamine, ethylene diamine, 2,4-tolylenediamine, and the like, and the $\alpha,\beta$-alkene amines, maybe reacted with isocyanate terminated intermediates.

Illustrative of other compounds which may be used to prepare the intermediates are the amides, e.g., adipamide, $\alpha,\beta$-alkene amides, etc.; mixed amino-containing compounds, e.g., monoethanolamine, 4-amino-benzoic acid, aminopropionic acid, etc.; sulfonamide containing compounds, e.g., 1,4-cyclohexanedisulfonamide, 1,3-propanedisufonamide, etc.

Illustrative of the olefinically unsaturated active hydrogen-containing compounds which may be reacted with the intermediates are those which contain at least one active hydrogen atom and at least one addition polymerizable olefincially unsaturated grouping, i.e., >C=C<. Those compounds containing one of each of these groups are preferred. Specifically illustrative of such monomeric unsaturated compounds are those containing active hydrogen atoms in groups mentioned above and an unsaturated grouping, preferably present as terminal unsaturation, i.e., the vinyl and acrylic compounds. It is preferred that the monomeric unsaturated compound contain from about 3 to about 12 carbon atoms. Exemplary unsaturated compounds are acrylic acid, cinnamic acid, methacrylic acid, hydroxyalkyl acrylates and methacrylates, e.g., hydroxyethyl acrylate and methacrylate, cinnamyl alcohol, allyl alcohol, diacetone acrylamide, unsaturated compounds containing secondary amino or amido groups, and the like.

Illustrative of the active hydrogen-containing compounds which may be reacted with the intermediates to form diluents and/or plasticizers are those not containing olefinic unsaturation indicated above, e.g., the alkanols, the phenols, the secondary amines, the carboxylic acids, etc. It is preferred that the compounds contain up to about 12 carbon atoms, more preferably up to about 18 carbon atoms.

A procedure which may be used to prepare the unsaturated monomers of this invention comprises placing about 2 equivalents of the organic diisocyanate in a reaction vessel for each equivalent of active hydrogen in the monomeric active hydrogen containing compound. The water-free diisocyanate may be reacted under an inert gas atmosphere, e.g., nitrogen, with the water-free active hydrogen containing compound at temperatures of from about room temperature to about 70° C. Elevated temperatures are preferred. The active hydrogen containing compound, e.g., polyol, must be added slowly, e.g. incrementally, with stirring or agitation to the diisocyanate which is maintained at the reaction temperature, e.g., 65°±5° C. by the rate of addition and/or heating and/or cooling depending on the exotherm developed. Instantaneous concentration of active hydrogen containing compound in the reaction mixture is kept low by slow, incremental addition thereof, thereby reducing or eliminating polymer formation. The temperature of the reaction is also kept under control and low enough so that allophonate and biuret formation and also any possible vinyl polymerization is eliminated or kept to a minimum. The reaction temperature is held until the theoretical free remaining isocyanate weight percent is obtained as determined by titration of an aliquot from the reaction vessel with dibutylamine.

When that reaction is theoretically complete, the temperature is maintained and there is added with agitation one equivalent of the second active hydrogen containing compound, which may or may not contain olefinic unsaturation, e.g., hydroxyethyl acrylate, for each equivalent of the remaining isocyanate groups on the intermediate. If the compound contains unsaturation, then a vinyl polymerization inhibitor, e.g., hydroquinone, is also added in an effective amount. Preferably a catalyst for the reaction may be added to increase the speed of the reaction. Illustrative of the catalysts which may be used are metallic catalysts, e.g., organo metallics such as organotin compounds, e.g., stannous octoate, dibutyl tin dilaurate etc., organo cobalt compounds, e.g., cobalt naphthenate, lead compounds, e.g., lead octoate, zinc compounds, e.g., zinc octoate. Other known catalysts such as mineral acids, e.g., hydrochloric acid, nitric acid or the like or phosphines can be used. If used, an effective amount should be present in the reaction. The agitation is continued for a period of time sufficient to assure complete reaction, i.e., no remaining free isocyanate groups. The reaction mixture is cooled and yields the essentially monomeric novel compounds of this invention, which may or may not contain unsaturation depending on the reactants.

Reversal of the addition procedure of the process of this invention—i.e., adding diisocyanate to e.g., polyol, rather than polyol to diisocyanate results in high viscosity, high molecular weight polymers, rather than the lower viscosity, lower molecular weight monomeric adducts of this invention.

The procedure for the preparation of the unsaturated monomers of this invention described above may be conducted with only the reactant, inhibitor and catalyst present; or in the presence of suitable solvents which may be subsequently removed, e.g., by vacuum stripping; or in a reaction medium of vinyl compounds, especially unsaturated esters, preferably higher boiling acrylates, e.g., ethyl hexyl acrylates, ethylene glycol diacrylate, trimethylolpropane triacrylate, pentaerythritol tetraacrylate, etc.; or a plasticizer such as those of this invention, or dioctyl phthalate, etc., as a solvent medium and plasticizer; or any combination thereof.

The above description generally illustrates but one procedure for the preparation of the compounds of this invention. Variations are possible and in many instances desirable. For example, one may use only one monoactive hydrogen containing compound and react it in one step with the diisocyanate. Consequently, the isocyanate terminated intermediate is not formed in a separate step, but transiently in an ongoing reaction to form the final product.

The unsaturated monomers which can be incorporated in inks and coating compositions for paper, wood, metal etc. according to this invention eminently meet the particular requirements of the respective utilities. Many are, or crosslink to form, compounds or resins which are oleophilic in character thereby providing adequate properties as inks. They are compatible with film-formers that are soluble in common organic solvents, generally substantially or completely insoluble in water, and are compatible both physically and chemically with fillers, pigments and dyes and other coloring agents. Moreover, the unsaturated monomers may be formulated into compositions which form good continuous films, have exceptional abrasion resistance, are sufficiently tough and hard for long wear, and have a requisite degree of resiliency and flexibility without undue brittleness. Chemical and physical stability, such as to the conditions of printing on offset presses and to the chemicals used in connection therewith, also are important properties possessed by the unsaturated monomers and their cross-linked reaction products.

The inclusion of fatty acid moieties, e.g., those containing from about 6 to about 18 carbon atoms, in the photopolymerizable compositions enhances the oleophilicity of those compositions for certain utilities, e.g., inks and lithographic plates.

It is possible to cure coatings of the instant compositions. For example, with suitable agents in compositions containing the unsaturated monomers, the monomers can be cross-linked or cured during exposure to actinic light and/or can be cured by heat instead of or before or after exposure to actinic light. Curing generally will enhance properties such as abrasion resistance, bonding to the substrate and cohesive character of the coating. Curing agents for this purpose are used in small amounts, i.e., in amounts less than about 5% by weight of the unsaturated monomer and generally less than about 1%, and include peroxides, for example dicumyl peroxide, and the like. The more stable peroxides are preferred.

Photopolymerizable compositions of this invention are comprised of unsaturated monomers of this invention and a photoinitiator component. The photoinitiator component, i.e., addition polymerization initiator activatable by actinic light, should be chosen carefully, both as to identity and concentration. It must be soluble in the overall composition or capable of substantially uniform distribution therethrough. Many such compounds are known, and they can be used singly or admixed in the present compositions. The photoinitiators are generally present in the compositions in amounts ranging from about 0.01% to about 10.0% with preferred quantities lying in the range of 0.1–5.0% based on the total composition.

Thus, the free radical generating addition polymerization initiators useful in these new compositions are those capable of initiating polymerization under the influence of actinic light which are dispersible in the aforesaid unsaturated monomers of this invention to form photopolymerizable compositions, to the extent necessary for initiating the desired polymerization under the influence of the light energy available and which are preferably not active thermally at temperatures below 80°–85° C. Preferably no other type of initiator is present except for the normally unavoidable, adventitious trace quantities of peroxides. The preferred initiators are obviously those which are most rapidly affected by the light energy available in the shortest exposure times to initiate the greatest number of growing polymer chains. These photopolymerization initiators are used in amounts of from 0.01–10.0% and preferably from 0.1–5.0% based on the weight of the entire composition. Suitably such initiators include vicinal ketaldonyl compounds, e.g., diacetyl, benzil, etc.; α-ketaldonyl alcohols, e.g., benzoin, pivaloin, etc.; acyloin ethers, e.g., benzoin methyl or ethyl ethers, etc.; α-hydrocarbon-substituted aromatic acyloins, including α-methylbenzoin, α-allylbenzoin [U.S. Pat. No. 2,722,512], and α-phenylbenzoin; the polynuclear quinones, such as anthraquinone, naphthoquinone, the aromatic ketones, e.g., 4,4'-bis [dimethylamino] benzophenone (Michler's ketone), etc.; the o-alkyl xanthate esters [U.S. Pat. No. 2,716,633]; and the like. The acyloin ethers and Michler's ketone are particularly useful.

Further illustrative known photosensitizer compounds are acetophenone, propiophenone, xanthone, benzophenone, fluorenone, triphenylamine, carbazole, 3-or 4-methylacetophenone, 3-or 4-pentylacetophenone, 3-or 4-methoxyacetophenone, 3-or 4-bromoacetophenone, 3-or 4-allylacetophenone, p-diacetylbenzene, 3-or 4-methoxybenzophenone, 3-or 4-methylbenzophenone 3-or 4-chlorobenzophenone, 4,4'-dimethoxybenzophenone, 4-chloro-4'-benzylbenzophenone, 3-chloroxanthone, 3,9-dichloroxanthone, 3-chloro, 8-nonylxanthone, 3-methoxyxanthone, 3-iodo-7-methoxyxanthone, n-butyl benzoin ether, and the like, metal compounds, dyes and the like.

Illustrative of free radical initiators which may be used are the dialkyl peroxides [cyclic or acyclic], diaryl peroxides, hydroperoxides, peracids, peresters, azo compounds, and other known free radical sources. Specifically illustrative thereof are di-tert-butyl peroxide, benzoylperoxide, 2,4-dichlorobenzoyl peroxide, t-butylhydroperoxide, 2,5-dimethyl-2,5-bis[hydroperoxy]-hexane, peracetic acid, perbenzoic acid, t-butyl peroxypivalate, t-butyl peracetate, azo bisisobutyronitrile, and the like.

As is obvious, one can use one or more photosensitizers or free radical initiators or combinations of each type or of both types. It is to be understood that any known photosensitizer or free radical initiator can be used; one is not restricted to those specifically referred to above.

It is preferable to admix in the photopolymerizable compositions minor amounts (about 50–100 parts per million by weight) of polymerization inhibitors so as to prevent spontaneous polymerization before desired. The presence of these inhibitors, which are usually of the antioxidant type, e.g., hydroquinone, tertiary butyl catechols, and the like, in such amounts causes no undesirable results in the photopolymerizable compositions of this invention either as to speed or quality of polymerization. In fact, larger quantities of such inhibitors, e.g., of the order of 200–1000 p.p.m., can easily be tolerated and may be advantageous in tending to reduce unwanted polymerization. Illustrative classes of stabilizers are the quinones, the phenols, benzophenone derivatives, Uvinuls TM, phenothiozines, naphthalamines and the like.

The photopolymerizable compositions may also contain other unsaturated monomers which are addition-copolymerizable with the unsaturated monomers of this invention.

Among the other monomers that can be used in the photoplymerziable compositions of this invention are the ethylenically unsaturated monomers containing at least one polymerizable ethylenically unsaturated group of the structure:

There can be used a single monomer or a mixture of two or more monomers throughout the entire concentration ranges possible, selected to suit the scientist's purpose. The monomers can be aliphatic, aromatic, cycloaliphatic, or any variant therof. Illustrative therof there can be mentioned the olefinic hydrocarbons containing up to about 18 carbon atoms, preferably the normally liquid one, e.g., pentenes, hexenes, dodecene, heptenes, octenes, styrene, 4-methylstyrene, alpha-methylstyrene, cyclo-pentadiene, 5-methyl 1-hexene, and the like; acrylic acid and its derivatives, such as acrylonitrile, methacrylonitrile, acrylamide, methacrylamide, methacrylic acid, methyl methacrylate, ethyl methacrylate, ethyl acrylate, 1-ethylhexyl acrylate, 2-ethylhexyl acrylate, hydroxyethyl acrylate, butoxyethoxyethyl acrylate, neopentyl glycol diacrylate, and the like; the vinyl halides such as vinyl chloride, vinylidene chloride, and the like; the vinyl esters such as vinyl acetate, vinyl propionate, vinyl butyrate, vinyl benzoate, and the like; the vinyl ketones such as isopropenyl methyl ketone, vinyl methyl ketone, alphachlorovinyl methyl ketone, and the like; the vinyl thioethers such as vinyl ethyl sulfide, vinylp-tolylsulfide, divinyl sulfide, and the like. Other monomers or monomer mixtures which are capable of polymerization by the process of this invention are divinyl sulfone, vinyl ethyl sulfone, vinyl ethyl sulfoxide, vinyl sulfonic acid, sodium vinyl sulfonate, vinyl sulfonamide, vinyl pyridine, N-vinyl pyrollidone, N-vinyl carbazole, and the like. Other suitable vinyl monomers are readily apparent to those skilled in the art. This listing is illustrative only and not all-inclusive. The preferred monomers include styrene and its derivative the acrylyl and methacrylyl compounds and derivatives thereof.

The photopolymerizable compositions may also contain any of the known crosslinkers, including but not limited to the polyunsaturated crosslinkers such as triallyl cyanurate, allyl acrylate, allyl methacrylate, diallyl terephthalate, N,N'-methylene diacrylamide, 1,2-ethylene diacrylate, diallyl maleate, diallyl fumarate, 1,2-ethylene dimethacrylate, hexamethylene bis maleimide, triallylphosphate, trivinyl trimellitate, divinyl adipate, trimethylolpropane triacrylate, glyceryl trimethacrylate, pentaerythritol tetraacrylate, diallyl succinate, divinylbenzene, and the like. The crosslinkers can be present at concentrations as high as about 90 percent, or more, but preferably less than 50 percent. The monomers and crosslinkers should be compatible in the compositions.

The photopolymerizable compositions may contain amounts of the unsaturated monomers of this invention ranging from 5 to 99% of the composition, preferably from about 10%–60%, and most preferably from about 20% to about 50% by weight. Other monomeric components are preferably present in amounts of from about 10% to about 60%.

In addition to the aforesaid components or mixtures thereof, the photopolymerizable compositions can also contain added preformed compatible condensation or addition polymers as well as immiscible polymeric or nonpolymeric, organic or inorganic fillers or reinforcing agents which are essentially transparent, e.g., organophilic silicas, bentonites, silica, fiber glass and powdered glass having a particle size less than 0.4 mil in their minimum dimension, and in amounts varying with the desired properties of the photopolymerizable layer.

Suitable preformed compatible polymers include the addition polymers generally, such as the polyvinyl acetals, e.g., polyvinyl butyral, formal and hydrolyzed derivatives thereof; and the like. Suitable compatible condensation polymers include both saturated and unsaturated types, such as the alkyd polymers, e.g., polyglycerol phthalate, polyglycerol maleate, and the like. Suitable modified natural polymers include the cellulose esters and ethers, e.g., cellulose acetate butyrate and ethyl cellulose. Other useful polymeric fillers include: the epoxies; ureas; phenolics; acrylics; polyesters, polyurethanes; the polymeric glycols and glycol ethers, e.g., the polyethylene glycol ethers; the polyethylene oxides, especially the 1000–5000 molecular weight species. The foregoing polymers will generally be used in only relatively minor amounts.

These added substituents can be present in all the foregoing compositions in order to modify their rheological properties, render the photopolymerizable compositions even more tack-free where desired, and make the composition more readily formable into sheets. Since a stiff sheet can be more easily handled in many forming operations, e.g., in preparing a photopolymerizable plate for use in making a printing plate, the use of filler materials such as the foregoing giving the requisite stiffness has commercial advantages. Mixtures of two, three, or more of the foregoing compatible polymers and/or fillers can be used in the photopolymerizable compositions, but in general the fillers should not be present in amounts exceeding about 40% by weight of the whole composition. With polymeric fillers amounts up to about 90%, preferably about 20% by weight of the whole give the best results. The amounts of those resins usually varies from about 10% to about 100% by weight based on the weight of the unsaturated monomer. The addition of resins to the coating composition tends to improve the presslife of a plate.

Inert, relatively non volatile, liquid or semiliquid plasticizers can be present and are efficacious when the compositions per se are too stiff, or when relatively low amounts of the low molecular weight polymerizable component, e.g., 10-15% by weight of the whole, are present. Suitable plasticizers are the lower molecular weight novel compounds of this invention, preferably the saturated compounds, but also the mono-unsaturated low viscosity compounds, which may function as reactive diluents or plasticizers.

It is possible to formulate liquid photopolymerizable compositions which are essentially 100% non-volatile (extremely low vapor pressure) and which emit essentially no volatiles before, during and after curing by exposure to actinic radiation.

When used as vehicles for inks, e.g., printing inks, the compositions of this invention may be pigmented with many organic or inorganic pigments, e.g., molybdate orange, titanium white, phthalocyanine blue, chrome yellow, and carbon black, as well as colored by conventional dyes. Stock which may be printed includes paper, clay-coated paper, board and metal. In addition, the compositions of the present invention are suitable for the treatment of textiles, both natural and synthetic, e.g., in vehicles for textile printing inks or for specialized treatments of fabrics to produce water repellency, oil and stain resistance, crease resistance, etc. The type and amount of pigment and dye used should be such that the curability of the photopolymerizable compositions is not adversely affected.

The photopolymerizable compositions of this invention are also useful as adhesives.

The 100 percent solids photopolymerizable coating compositions may be produced by mixing the selected components thereof by conventional known methods. The blend can be heated, if desired, to facilitate mixing, or the components may be present during synthesis, i.e., solvent, monomers, etc.

The coating compositions may be applied by conventional means, including spray, curtain, dip, pad and roll-coating techniques and may, if desired, be dried under ambient or oven conditions to provide coating films on the substrate. The substrate can be any composition, e.g., wood, metal, paper, plastic, fabric, fiber, ceramic, concrete, plaster, glass, etc.

Although reference has been made herein to 100 percent solids coating compositions, it is to be understood that the coating compositions can also contain solvents and can be used to coat articles. The coating is then crosslinked after evaporation of the volatile solvent.

A solvent may be used to blend the unsaturated monomer and any other components in the photopolymerizable compositions, and to coat them as an integral composition onto an appropriate substrate. A suitable solvent desirably should dissolve both the unsaturated compound and the other components at least to an extent that a commercially practical coating solution is formed, a solution in which the unsaturated compound and other components are compatibly retained in the proportions desired for the coating subsequently to be formed on the substrate from the solution.

Practical organic solvents, used alone or in combination with others, and which are thus presently preferred according to this invention, include methylene chloride, dimethyl formamide, dimethyl sulfoxide, butyl Carbitol, methyl Cellosolve, methyl Cellosolve acetate, ketones such as acetone, methyl ethyl ketone and cyclohexanone, ethers such as trioxane and dioxane, and heterocyclics such as tetrahydrofuran, pyridine and isophorone. Methyl Cellosolve and methyl ethyl ketone are particularly suitable solvents to use.

The amount of solvent may be varied to suit any desired utility. Amounts from about 10 to about 15% may be useful.

Coating thickness depends mainly on the concentration of the coating composition and the mechanical means by which it is applied to base sheets. For example, in a continuous process wherein a roll of sheet aluminum is passed through a coating tank, there must be taken into account for each particular system the speed of the web, the tank length, subsequent drying time and temperature, and solvent volatility, if any is used. The concentration of the coating composition can vary. Presently from about 10 to about 90 parts of unsaturated monomer per 100 parts of composition can be used, good results being obtainable at concentrations of about 10 to about 50 parts thereof.

The photopolymerizable compositions of this invention when irradiated under a suitable actinic light source are converted to a cross-linked insoluble matrix. This insolubility may be useful for a variety of purposes. For example, if certain areas of a coating are cured and certain are not, as, for example, when the coating is exposed through a negative transparency, the coating may then be treated with a solvent or developer whereby the exposed areas are not dissolved and removed, but the unexposed areas are. Depending on the substrate, such as metals and plastics, fabric, paper, etc. there can be formed, for example, storage-stable presensitized lithographic plates, printed circuit boards, presensitized silk screens, or presensitized paper printing mats.

Coatings containing the unsaturated monomers of this invention and diazo compounds, particularly on lithographic plates, are described in a patent application of William Rowe and Eugene Golda filed concurrently herewith.

A presensitized lithographic plate or other articles made as described above may be exposed to light through an image transparency and the non-image area may be removed by developing the plate. The methods and means of exposing and developing the exposed plate are those well known and commonly used in the lithographic art.

Although the mechanism of the light-promoted reactions induced by initiators is not clearly understood, it does appear that the reaction(s) cause a sufficient differential between exposed and unexposed areas on the plate so that the developing solution effects removal of the non-image area without affecting the image area. In the case of a negative-acting system, one or more of several reactions might occur in the exposed image area to harden it and render it stable to the developer. For example, the diazonium might react with the unsaturated monomer by a free-radical or some other mechanism, perhaps to form cross-links, or might react with itself. While similar reactions might occur in the positive-acting diazonium components, it seems more likely that the light-promoted reaction renders them susceptible to the developing solution.

Actinic light from any source and of any type can be used in the photopolymerization processes of this invention. The light can emanate from point sources or be in the form of parallel rays or divergent beams. Inasmuch as the free-radical generating, addition polymerization initiators activatable by actinic light generally exhibit their maximum sensitivity in the ultraviolet range, the light source should furnish an effective amount of this radiation. Such sources include carbon arcs, mercury-vapor lamps, fluorescent lamps with special ultra-violet light-emitting phosphors, argon glow lamps, and photographic flood lamps. Of these, the mercury-vapor lamps, particularly the sun lamp type, and the fluorescent sun lamps, are most suitable.

Among the numerous improvements and advantages provided by this invention are, briefly, the provision of photosensitive compositions that can be applied as a single coating onto an appropriate substrate, which coating (1) is more light-sensitive, i.e., faster, than many prior art photosensitive systems, (2) is not adversely affected by storage in air, (3) cures on the substrate to form a durable, abrasion resistant, solvent resistant finish, (4) may be developed on a substrate with relatively inexpensive, non-volatile, non-toxic, wholly or substantially wholly aqueous desensitizing or developing solutions, (5) has on the base substantially at least the shelf life, storability, light-sensitivity and durability of, e.g., currently commercial presensitized lithographic plates, and generally substantially longer presslife, (6) requires no hand lacquering after development, (7) can be satisfactorily developed to form high quality, sharp, fine objective areas or images quickly and easily by development with aqueous developers, (8) many of the cured formulations exhibit outstanding resistance to attack by chemicals, e.g., hydrofluoric acid, solvents, etc.

The following Examples are intended to be illustrative of this invention and not as limiting the scope thereof.

In the Examples, viscosities mentioned were determined by means of a Gardner VG-7380 Bubble Viscometer, Alphabetical, Heavy Series (sometimes referred to as "Gardner-Holdt 1933"), a product of Gardner Laboratory, Inc., Bethesda, Md 20014. This viscometer is a set of twelve (12) bubble tube standards, designated by letters U to Z10. The following table gives the approximate value in Stokes of each standard:

| Tube | Approximate Stokes | Tube | Approximate Stokes |
|------|--------------------|------|--------------------|
| U    | 6.2                | Z3   | 46.3               |
| V    | 8.8                | Z4   | 63.4               |
| W    | 10.7               | Z5   | 98.5               |
| X    | 12.9               | Z6   | 148.0              |
| Y    | 17.6               | Z7   | 388                |
| Z    | 22.7               | Z8   | 590                |
| Z1   | 21.0               | Z9   | 855                |
| Z2   | 36.2               | Z10  | 1066               |

Below is a discussion of the operating principles underlying the Gardner Bubble Viscometers and the Comparison Method used in determining the viscosities which are reported in the following Examples:

Operating Principles:

The time for a given volume of liquid to flow out under gravity through a capillary, or other restrictive orifice, is a measure of its kinematic viscosity, and therefore it can be translated into stokes and centistokes. These conditions prevail in a Gardner Bubble Viscometer, where a liquid streams downwards in the annular zone between the glass wall of a sealed tube and the perimeter of a rising air-bubble. Under controlled conditions and within certain limits, the rate at which the air-bubble rises is a direct measure of the kinematic viscosity of streaming liquids commonly used either as raw materials or formulated products in the paint, varnish and lacquer industry. However, many other types of anomalous materials may be tested for their relative viscosity by comparing their bubble speeds against those of known liquids.

For best results, particularly when the direct timing method is used to obtain a reproducible number value for a sample contained in a single tube, certain precautions must be taken. True verticality of a glass tube with a standard bore, as well as constant temperature control, must prevail. For low-viscosity liquids with bubble-speeds below 5 seconds it is advisable to make direct comparisons against standard tubes marked either in letters, or numbers, representing approximate stoke values.

Comparison Method (Using Lettered Tubes A5–Z10);

(1) Fill either a Grade A (marked MT for exact referee tests) or Grade B (unmarked for control tests) 2-line, empty sample tube to the first line with the sample material. Avoid smearing the glass wall above the second line.

(2) Insert a clean cork loosely into the tube and transfer to a constant temperature bath at 25° C. (77° F.) for at least 10 minutes.

(3) Adjust the level of the sample exactly to the first line. Insert the clean cork against clean glass and seat it firmly to the second line. This insures the formation of an air-bubble of proper size and pressure.

(4) Place the corked sample tube and one or more sealed standard lettered tubes side-by-side in an appropriate viscosity-tube holder, invert all the tubes, and bring them to constant temperatures as before.

(5) Invert all the tubes in the holder quickly through 180°. Compare the bubble speeds visually by lining up the bottom of each bubble after it is moving freely up the tube. It may be necessary to raise one or more of the tubes in order that all bubbles have an even start, because of the uneven thickness of the glass wall at the bottom of the tubes.

(6) Report the viscosity of the sample with reference to the nearest "tube letter."

The following examples are illustrative of this invention.

EXAMPLE 1

Tolylene diisocyanate (a mixture of 80% 2,4 and 20% 2,6 isomers; 261 grams, 3 equivalents) is placed in a three-neck round bottom flask fitted with motorized stirrer, funnel, water-cooled condenser, thermometer and nitrogen inlet tube. The temperature of the diisocyanate is raised to about 65°±5° C., the nitrogen is swept through the head-space in the flask and then castor oil (513.5 grams, 1.5 equivalent), providing 2 equivalents of diisocyanate to each equivalent of castor oil, is added slowly by increments with stirring to the diisocyanate. The temperature is maintained by adjusting the rate of addition, by heating or cooling, or by application of a sequence of these steps as necessary. The addition is complete in about two hours. The reaction is completed with an aliquot of the reaction mixture contains the calculated amount of free NCO in the product as determined by titration with dibutylamine.

At completion, the temperature is maintained, and there is added with agitation a vinyl polymerization inhibitor, hydroquinone, in an amount of 0.28 grams.

Dibutyl tin dilaurate (0.475 grams) is mixed with 185 grams of hydroxyethyl acrylate, providing slightly more than one equivalent of hydroxyethyl acrylate for each equivalent of the remaining isocyanate groups on the intermediate, and the mixture is added to the reaction mixture over a 1 to 2 hour period. The agitation is continued for a period of time sufficient to assure complete reaction, i.e., no remaining free isocyanate groups, approximately 15-20 minutes. The reaction mixture is cooled and yields one of the essentially monomeric novel compounds of this invention.* The compound is substantially comprised of the castor oil moiety, each of the hydroxyl groups of which is reacted with one isocyanate of a molecule of the diisocyanate producing a urethane linkage and leaving three free NCO groups, which are reacted with the active hydrogen of the hydroxyethyl acrylate. Schematically, it may be represented as

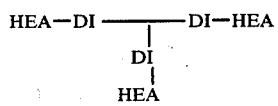

wherein T represents the triol, DI the diisocyanate and HEA the hydroxyethyl acrylate moieties.
* The reacted mixture may at this point be vacuum distilled to remove any excess of unreacted hydroxyethyl acrylate if it is so desired.

The unsaturated monomer of this invention so produced has the following properties:
Viscosity—$Z_6$-$Z_7$ Gardner-Holdt at 100% solids
NCO content=0%

EXAMPLE 2

The procedure of Example 1 is repeated but 135 grams of trimethylolpropane is substituted for the castor oil. 774 grams of ethyl acetate/toluol (3:1) as solvent (50:50 solution) is used in the reaction mixture. The trimethylolpropane analog is prepared in solution, which solution had the following properties:
Viscosity=C to E Gardner-Holdt Viscosity
NCO=0%

EXAMPLE 3

The procedure of Example 2 was repeated, but 3 equivalents of hexamethylene diisocyanate was used in place of the tolylene diisocyanate. 3 Moles of hydroxypropyl acrylate was used in place of hydroxyethyl acrylate and reacted to 0% NCO in sufficient triethylene glycol dimethacrylate so that the reaction product is 60% of the mixture. The solution had a viscosity of $Z_4$ (Gardner-Holdt). The mixture was clear and water white.

One hundred parts of the above mixture mixed with 3 parts of benzoin butyl ether and spread as a 3 mil coating cured to a hard material when irradiated at a distance of 9" from the Polychrome 3000 watt high pressure mercury lamp for 30 seconds.

EXAMPLE 4

Following the general procedure of Example 1, there was prepared a novel compound of this invention from the following reactants:

| Reactant | Moles |
|---|---|
| The adduct of one mole of trimethylolpropane with three moles of propylene glycol. This adduct is 1,1,1 trihydroxy tris propoxy methoxy propane. | 1 |
| Tolylene Diisocyanate | 3 |
| Hydroxyethyl acrylate | 3 |

There was actually used an excess of hydroxyethyl acrylate such that the reaction product comprised 80 parts and the excess hydroxyethyl acrylate comprised 20 parts by weight of the mixture.* The reacted mixture was clear and had a Gardner-Holdt viscosity of from $Z_6$-$Z_7$ and 0% free NCO. When about 3% of benzoin butyl ether was incorporated in the mixture and then the resulting mixtue was spread as a 20 mil film on particle board, the film cured to a tough marproof state upon about 15 seconds irradiation at a distance of about 3" from the Polychrome high pressure mercury lamp (3000 watts).
*The excess hydroxyethyl acrylate is a reactive diluent within the reaction mixture and also functions as a viscosity regulator.

EXAMPLE 5

Example 4 was repeated, but hydroxypropyl acrylate was used in place of hydroxyethyl acrylate and the excess was not the hydroxyethyl acrylate, but rather pentaerythritol triacrylate, in an amount equal to the sum of the other reactants, giving a mixture of end groups and a remaining mixture of product and pentaerythritol triacrylate, and hydroxyethyl acrylate.

The mixture had a Garner-Holdt viscosity of $Z_7$ and 0.0% NCO. When the mixture was cured in the same manner as in Example 4, the results were similar.

EXAMPLE 6

Example 4 was repeated but 40 parts of diallylphthalate were present for each 60 parts of the reaction product. Gardner-Holdt viscosity was $Z_3$ for the mixture and 0% NCO was found. Testing of the mixture for curability in a manner similar to that of Example 4 produced results similar to those in that Example.

EXAMPLE 7

Example 1 was repeated, but the reactants were as follows:

| Reactant | Moles |
|---|---|
| Trimethylol propane | 1 |
| Hexamethylene diisocyanate | 3 |
| Hydroxypropyl acrylate | 3 |

There was present in the reaction mixture 40 parts of pentaerythritol tetraacrylate to 60 parts of the reactants. The resulting mixture was clear and had a viscosity of approximately $Z_7$ and 0% NCO. When about 3% of butyl benzoin ether was admixed with that mixture and the resulting mixture spread as a 3 mils thick film on particle board, the film cured and had a marproof surface in 1/6 second when exposed at a distance of about 2" from an Addolux air cooled low pressure mercury lamp sold by Berkey Photo Company.

EXAMPLE 8

The procedure of Example 1 is generally followed with the following reactants:

| REACTANTS | MOLES |
|---|---|
| Trimethylolpropane | 1 |
| Tolylene diisocyanate | 3 |
| Cinnamyl alcohol | 3 |

The reaction was conducted in sufficient ethyl acetate as solvent so that the product was present in an amount of 60% of the mixture. The mixture had a viscosity of N to O and when tested for curability as in Example 7, resulted in a hard marproof surface.

EXAMPLE 9

The procedure of Example 1 is generally followed with the following reactants:

| REACTANTS | MOLES |
|---|---|
| Trimethylolpropane | 1 |
| Tolylene diisocyanate | 3 |
| Acrylic acid | 3 |

The reaction is conducted in sufficient ethyl acetate as solvent so that the product is present in an amount of 60% of the mixture. When tested for curability as in Example 7, the mixture produces a marproof surface.

EXAMPLE 10

The procedure of Example 1 is generally followed with the following reactants:

| REACTANTS | MOLES |
|---|---|
| Trimethylolpropane | 1 |
| Tolylene diisocyanate | 3 |
| Cinnamic acid | 3 |

The reaction is conducted in sufficient ethyl acetate as solvent so that the product is present in an amount of 60% of the mixture. When tested for curability as in Example 7, the mixture cures to a hard, marproof surface.

EXAMPLE 11

The procedure of Example 1 is generally followed with the following reactants:

| REACTANTS | MOLES |
|---|---|
| Trimethylolpropane | 1 |
| Dimer fatty acid diisocyanate product (General Mills DDI-1410) | 3 |
| Hydroxyethyl acrylate | 3 |

When tested for UV-curability as in Example 7, the product results in a marproof surface.

EXAMPLE 12

The procedure of Example 1 is generally followed with the following reactants:

| REACTANTS | MOLES |
|---|---|
| Trimethylolpropane | 1 |
| Hexamethylene diisocyanate | 3 |
| Methyl cellosolve | 3 |

When 77 parts of the reaction product was mixed with 23 parts of pentaerythritol tetraacrylate and the mixture tested for curability as in Example 7, there was produced a plasticized softer cured surface than would be produced without the presence of the reaction product in the mixture.

EXAMPLE 13

The procedure of Example 1 is generally followed with the following reactants:

| REACTANTS | EQUIVALENTS |
|---|---|
| Propylene glycol monoricinoleate | 2 |
| Tolylene diisocyanate | 4 |
| Hydroxyethyl acrylate | 2 |

The reaction product had a Gardner-Holdt viscosity of Z6 and when tested for curability as in Example 7, resulted in a marproof surface. This reaction product is useful as a reactive plasticizer in, e.g., the photopolymerizable compositions of this invention.

EXAMPLE 14

The procedure of Example 1 is generally followed with the following reactants:

| REACTANTS | EQUIVALENTS |
|---|---|
| Tolylene diisocyanate | 3 |
| Hydroxyethyl methacrylate | 3.15 |

The reaction product mixture was a clear semisolid with 0% NCO which was curable in the presence of a photoinitiator. The product is useful as a reactive plasticizer.

EXAMPLE 15

The following mixture was prepared:

| INGREDIENT | PARTS BY WEIGHT |
|---|---|
| The unsaturated product of Example 1 | 50 |
| Pentaerythritol tetraacrylate | 50 |
| Benzoin butyl ether | 5 |
| Hydroquinone | 0.01 |

When the mixture was spread on a particle board in a 10 mil thickness and irradiated under a water-cooled, high pressure mercury lamp unit (3000 watts, distributed by Polychrome Corp.) at a distance of 2 inches in air (no inert atmosphere necessary), it cured in 15 seconds and was marproof and acetone resistant.

EXAMPLE 16

An ink was prepared by adding to the formulation of Example 15, 15 parts of carbon black and grinding the mixture on an ink mill (3 roller). When the prepared ink was applied as a 2 micron film on white bond by the "quick peek" procedure used in the ink industry, the film was curable in air in 4 seconds (no inert atmosphere necessary) at distance of 2 inches from the high pressure mercury lamp mentioned in Example 15.

Maximum useful pigment concentrations in the inks containing the photopolymerization compositions of this invention will depend on the reflectance or absorption of light by the pigment used. Successful curing has been obtained with inks containing up to 50% of titanium dioxide or up to 15% carbon black or phthalocyanine blue.

EXAMPLE 17

The procedure of Example 1 is generally followed with the following reactants:

| REACTANTS | EQUIVALENTS |
| --- | --- |
| Desmodur TM N-100 available from Mobay Chemical Co., which is understood to be produced in accordance with U.S. Patent 3,124,605 and is a biuret polyisocyanate having an average of 2.6 isocyanate groups per molecule and equivalent weight of 195 and produced by reacting 3 moles of hexamethylene diisocyanate with 1 mole of water as the active hydrogen containing compound. | 3 |
| Hydroxyethyl acrylate | 3.15 |

There was present in the reaction mixture sufficient ethylacetate to form a 60% solution of the reactants. The reaction product had 0% NCO and was a clear, thin solution.

EXAMPLE 18

The following mixture was prepared:

| INGREDIENT | PARTS BY WEIGHT |
| --- | --- |
| The reaction product mixture from Example 17 | 167 |
| Benzoin butyl ether | 5 |
| Hydroquinone | 0.01 |

When the mixture was spread on a particle board in a 3 ml thickness (after evaporation of the solvent) and irradiated under a water-cooled, high pressure mercury lamp unit (5,000 watts, distributed by Polychrome Corporation) at a distance of 2 inches in air (no inert atmosphere necessary), it cured in 15 seconds and was mar-proof and acetone resistant.

EXAMPLE 19

Desmodur TM N-100, 1462.5 grams (described in Example 17), pentaerythritol tetraacrylate, 1612.5 grams, and hydroquinone, 0.73 grams, are placed in a three-necked, round bottom flask fitted with motorized stirrer, funnel, water-cooled condensor, thermometer and nitrogen inlet tube. The temperature of the mixture is raised to about 65° C.±5°, the nitrogen is swept through the headspace in the flask and then a mixture of 960 grams of hydroxyethyl acrylate with 1.21 grams dibutyl tin dilaurate is added over a period of 1–2 hours. The temperature is maintained by adjusting the rate of addition, by heating or cooling, or by application of a sequence of these steps if necessary. Reaction mixture was held to a viscosity range of approximarely Z-6–Z-8 and 0.0% free NCO. The excess hydroxyethyl acrylate, if any, may be left in the reaction product or may be vacuum distilled to remove any excess or unreacted mono hydroxyethyl acrylate if it is so desired.

EXAMPLE 20

| INGREDIENT | PARTS BY WEIGHT |
| --- | --- |
| Reaction product from | |

| INGREDIENT | PARTS BY WEIGHT |
| --- | --- |
| Example 19 | 100 |
| Benzoin butyl ether | 4 |

When the mixture was spread on a particle board in a 3 ml thickness and the board placed on a moving belt at various speeds, indicated in the following table, under a Berkey Photo Co. lamp and then irradiated with the bulb being 3″ from the coating and the shutter on the lamp being adjusted for a 1″ opening perpendicular to the line of travel, the results were as indicated in the table.

| SPEED OF TRAVEL | CURE* TIME | REMARKS* |
| --- | --- | --- |
| 16 fpm | 0.3 seconds per linear inch of travel | No effect-film intact |
| 36 fpm | 0.14 seconds per linear inch of travel | No effect-film intact |
| 50 fpm | 0.1 seconds per linear inch of travel | Slight dulling-film intact |
| 65 fpm | 0.08 seconds per linear inch of travel | Slight dulling-film intact |

*Cure determined by rubbing film 100 times with Methyl Ethyl Ketone.

The film lost no detectable volatiles during curing for 60 seconds with a dosage at the surface of 138 mw/cm². A 3 ml film of the coating on glass with the same dosage for 15 seconds had a Sward hardness of greater than 50.

A sample having a 3.5 ml thickness of coating on a particle board cured under the Addalux lamp at 0.6 seconds per linear inch of travel showed excellent resistance to attack by a wide range of chemicals including ketones, hydrofluoric acid, sulfuric acid, nitric acid, iodine solution, sodium hydroxide solutions, ammonium hydroxide solutions, dimethyl sulfoxide, ferric nitrate copper etching solution, dimethyl formamide, aliphatic, aromatic or oxygenated solvents or trichlorethylene.

Compounds which are not fully esterified, e.g., pentaerythriol di- or triacrylate, may be used in the formulations, e.g., that of Example 20, to vary the properties of the cured products.

The following Experiment shows the undesirable results which are achieved when the process of this invention is not followed.

EXPERIMENT 1

The procedure of Example 1 was followed but the initial reaction step was reversed, i.e., the tolylene diisocyanate was slowly added by increments to the castor oil. There was produced a polymeric product which had a Gardner-Holdt viscosity of Z9+, much higher than produced by the process of this invention in Example 1, thereby indicating the product of this invention to be monomeric in nature.

EXPERIMENT 2

Following the procedure of Example 6 of U.S. Pat. No. 3,509,234 there was obtained a gelled resin having 1.2% NCO, which was insoluble in solvents.

What is claimed is:

1. An ultraviolet radiation room temperature curable monomeric substantially water-insoluble composition which comprises the admixture of,
   I. the reaction product of,
      A. one equivalent of an isocyanate containing intermediate which is the reaction product of (i) about one equivalent of an organic, monomeric compound which contains more than one active hydrogen with (ii) two equivalents of an organic polyisocyanate and, B. one equivalent of a monomeric olefinically unsaturated compound containing exactly one active hydrogen and, II. a photoinitiator said composition being a monomeric, solvent free liquid containing zero percent free isocyanate groups.

2. The composition of claim 1 wherein said compound (i) is a polyol.

3. The composition of claim 1 wherein said polyisocyanate is a diisocyanate.

4. The composition of claim 1 wherein said compound (B) is an acrylate or methacrylate.

5. The composition of claim 1 wherein compound (i) is a triol.

6. A process for the preparation of the monomeric, solvent free, liquid, ultraviolet radiation room temperature curable substantially water-insoluble composition containing zero percent free isocyanate groups of claim 1 which comprises, I. slowly adding about one equivalent of an organic monomeric compound which contains more than one active hydrogen to two equivalents of an organic polyisocyanate while maintaining the reaction temperature at from about room temperature to about 70 degrees C., said reaction product being monomeric, II. adding an effective amount of a polymerization inhibitor;

III. slowly reacting the above mixture with a sufficient amount of a monomeric, olefinically unsaturated compound containing exactly one active hydrogen until no free isocyanate groups remain while maintaining the reaction temperature at from about room temperature to about 70 degrees C.;

IV. adding an effective amount of a photoinitiator.

7. The composition of claim 1 wherein said compound (i) is a composition selected from the group consisting of castor oil, trimethylolpropane and propylene glycol monoricinolate; said polyisocyanate (ii) is a composition selected from the group consisting of tolylene diisocyanate and hexamethylene diisocyanate; and said compound (B) is selected from the group consisting of hydroxyethyl acrylate, hydroxypropyl acrylate, pentaerythritol triacrylate, pentaerythritol tetraacrylate, cinnamyl alcohol, acrylic acid, cinnamic acid, and hydroxyethyl methacrylate.

8. The composition of claim 1 wherein said compound (i) comprises one or more compounds selected from the group consisting of aliphatic, aromatic or cycloaliphatic hydroxyl, mercapto, imino, amino, carboxyl, carbamoyl, substituted carbamoyl, sulfo, sulfonamido, thiocarbamoyl and substituted thiocarbamoyl compounds.

9. The composition of claim 1 wherein said polyisocyanate (ii) comprises one or more compositions selected from the group consisting of, 2,4-tolylene diisocyanate, m-phenylene diisocyanate, xylylene diisocyanate, 4-chloro-1, 3-phenylene diisocyanate, 4,4'-biphenylene diisocyanate, 1,4-tetramethylene and 1,6-hexamethylene diisocyanate, 1,4-cyclohexylene diisocyanate, 1,5-tetrahydronaphthalene diisocyanate, methylene dicyclohexylene diisocyanate and biuret polyisocyanates.

10. The composition of claim 1 wherein said compound (B) comprises one or more compositions selected from the group consisting of, acrylic acid, cinnamic acid, methacrylic acid, hydroxyalkyl acrylates and methacrylates, cinnamyl alcohol, allyl alcohol, diacetone acrylamide and unsaturated compounds containing secondary amino or amido groups.

* * * * *